(12) United States Patent
Ohnishi

(10) Patent No.: US 6,832,363 B2
(45) Date of Patent: Dec. 14, 2004

(54) HIGH-LEVEL SYNTHESIS APPARATUS, HIGH-LEVEL SYNTHESIS METHOD, METHOD FOR PRODUCING LOGIC CIRCUIT USING THE HIGH-LEVEL SYNTHESIS METHOD, AND RECORDING MEDIUM

(75) Inventor: Mitsuhisa Ohnishi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/166,094

(22) Filed: Jun. 11, 2002

(65) Prior Publication Data

US 2002/0188923 A1 Dec. 12, 2002

(30) Foreign Application Priority Data

Jun. 11, 2001 (JP) ........................................ 2001-176375

(51) Int. Cl.⁷ .............................................. G06F 17/50
(52) U.S. Cl. ............................................ 716/18; 716/1
(58) Field of Search ...................................... 716/18, 1

(56) References Cited

U.S. PATENT DOCUMENTS

| | | | | | |
|---|---|---|---|---|---|
| 4,799,141 | A | * | 1/1989 | Drusinsky et al. ............. | 700/12 |
| 5,446,852 | A | * | 8/1995 | Hilpert et al. ............... | 713/300 |
| 5,686,767 | A | * | 11/1997 | Helfrich et al. .............. | 307/64 |
| 5,935,253 | A | * | 8/1999 | Conary et al. ............... | 713/322 |
| 6,042,613 | A | * | 3/2000 | Tsukamoto ................. | 716/18 |
| 6,195,786 | B1 | * | 2/2001 | Raghunathan et al. ......... | 716/2 |

FOREIGN PATENT DOCUMENTS

| EP | 0 829 812 A2 | 3/1998 |
|---|---|---|
| JP | 10-116302 | 5/1998 |

OTHER PUBLICATIONS

Benini et al.,"Saving Power by Synthesizing Gated Clocks for Sequential Circuits", Winter 1994, IEEE Design & Test of Computers, vol. 11, iss. 4, pp. 32–41.*
Piguet et al., "Low–Power Embedded Microprocessor Design", Sep. 1996, IEEE, Proceedings of the 22$^{nd}$ EURO-MICRO Conference, "Beyond 2000: Hardware and Software Design Strategies", pp. 600–605.*
Oelmann et al., "Asynchronous Control of Low–Power Gated–Clock Finite–State–Machines", Sep. 1999, IEEE Proceedings of Th 6$^{th}$ International Conference on Electronics, Circuits and System, vol. 2, pp. 915–918.*
L. Benini et al., "Synthesis of Low–Power Selectively–Clocked Systems from High–Level Specification," ACM Transactions on Design Automation of Electronic Systems, vol. 5, No. 3, Jul. 2000, pp. 311–321.
Chih–Tung Chen et al., "An Architectural Power Optimization Case Study using High–level Synthesis," Computer Design: VLSI in Computers and Processors, 1997. ICCD '97. Proceedings, 1997 IEEE International Conference, Austin, Texas, Oct. 12–15, 1997, pp. 562–570.

(List continued on next page.)

*Primary Examiner*—Vuthe Siek
*Assistant Examiner*—Sun James Lin
(74) *Attorney, Agent, or Firm*—Birch, Stewart, Kolasch & Birch, LLP

(57) ABSTRACT

A high-level synthesis apparatus for synthesizing a register transfer level logic circuit from a behavioral description describing a processing operation of the circuit, comprises a low power consumption circuit generation section for generating a low power consumption circuit which stops or inhibits circuit operations of partial circuits constituting the logic circuit only when the partial circuits are in a wait state, so to achieve low power consumption. The low power consumption circuit generation section is synthesized along with the logic circuit.

14 Claims, 17 Drawing Sheets

OTHER PUBLICATIONS

A.C. Williams et al., "Simultaneous optimisation of dynamic power, area and delay in behavioural synthesis," IEE Proceedings, Computers & Digital Techniques, Institution of Electrical Engineers, Stevenage, GB, vol. 147, No. 6, Nov. 28, 2000, pp. 383–390.

I. Page, "Constructing Hardware–Software System from a Single Description," Journal of VLSI SIngal Processing Systems for Signal, Image, and Video Technology, Kluwer Academic Publishers, Dordrecht, NL, vol. 12, No. 1, 1996, pp. 87–107.

L. Benini, et al., "Designing Low–Power Circuits: Practical Recipes," IEEE Circuits and Systems Magazine, 2001, IEEE, USA, vol. 1, No. 1, pp. 6–25.

"Bach: Enivornment for LSI Design with C Language", A. Yamada, et al.; The 11$^{th}$ Workshop on Circuits and Systems, Apr. 20–21, 1998 pp. 469–474.

"Hardware Compiler Bach", Koichi Nishida, et al.; The Institute of Electronics Information and Communication Engineers, Technical Report of IEICE 1997, pp. 143–148.

"A Method of Low Power Design for Bach System", M. Onishi, et al; 2001, pp. 119–123.

* cited by examiner

FIG.2A

```
 1: void f(chan int i, chan int o)
 2: {
 3:    chan int ch;
 4:    int x,y,z;
 5:
 6:    par{
 7:       {/*thread1*/
 8:          while(1){
 9:             x = receive(i);
10:             y = receive(i);
11:             z = (x+y) * (x-y);
12:             send(ch, z);
13:          }
14:       }
15:       {/*thread2*/
16:          while(1){
17:             send(o,receive(ch));
18:          }
19:       }
20:    }
21: }
```

Lines 7–14: Thread 1
Lines 15–19: Thread 2

FIG.2B

|          | Read channel | Write channel |
|----------|--------------|---------------|
| Thread 1 | i            | ch            |
| Thread 2 | ch           | o             |

Thread 1

Read channel : i
Write channel : ch

Thread 2

Read channel : ch
Write channel : o (a) Gated clock using AND logic element (b) Gated clock using OR logic element

```
1: func()
2: {
3:    chan int ch;
4:    int x;
5:
6:    par{
7:       { send(ch, 10);}
8:       { x=receive(ch);}
9:    }
10:   putint(stdout,10,0,x);
11: }
```

HIGH-LEVEL SYNTHESIS APPARATUS, HIGH-LEVEL SYNTHESIS METHOD, METHOD FOR PRODUCING LOGIC CIRCUIT USING THE HIGH-LEVEL SYNTHESIS METHOD, AND RECORDING MEDIUM

BACKGROUND OF THE INVENTION

1. Field of the Invention

The present invention relates to a high-level synthesis apparatus for automatically generating a logic circuit for a semiconductor integrated circuit (LSI) represented by a behavioral description (design data) in which processing behaviors of the logic circuit are described. The present invention also relates to a high-level synthesis method using the high-level synthesis apparatus, a method for producing a logic circuit using the high-level synthesis method, and a computer-readable recording medium storing a control program for carrying the high-level synthesis method.

2. Description of the Related Art

Recent micro processing technologies have allowed larger system LSIs. A development environment in which such system LSIs can be efficiently designed and tested is much sought after.

In the 1990s, a logic synthesis tool was developed into practical use. Following this, a behavioral synthesis tool for synthesizing a description having a register transfer level (hereinafter referred to as an RT level) based on a behavioral description in which only behaviors are described excluding information on hardware structure was put into use. The behavioral synthesis tool generated LSI designs, comparable to those manually produced, in a shorter period of time.

When such a behavioral synthesis tool is used, a designer can concentrate his or her efforts on designing an algorithm, which determines an essential behavior of an LSI. Such design of an algorithm largely relies on manual work. As a result, the quality of a circuit can be improved.

At an early stage of the designing of a large digital LSI, such as a system LSI, an algorithm of an entire system is first studied and tested (this process is referred to as an "algorithm design"). Here, a software description language, such as a programming language (e.g., the "C language"), is used to design and test an algorithm on a workstation or a personal computer.

Subsequently, individual processes required in a system are described with a hardware description language into behavioral descriptions which will be tested. Therefore, an algorithm previously described with a software description language is described again with a hardware description language into a behavioral description.

Hence, conventionally, a method (high-level synthesis method) for synthesizing a circuit based on an algorithm of an entire system or a behavioral description using the C language was proposed. Such a conventional technique is, for example, disclosed in Japanese Laid-Open Publication No. 10-116302, entitled "Method for Designing Integrated Circuit and Integrated Circuit Designed by the Method".

At present, a language having a high level of abstractness, such as the "C language", is used to describe a behavior of hardware which realizes an application, such as audio or video processing, and to synthesize a hardware circuit (high-level synthesis).

Firstly, a behavioral description language will be described. Hereinafter, the C language is extended for the purpose of behavioral description in the following description. Specifically, the extended C language includes par sentences for explicitly describing parallel operations, commands for data communication between the parallel operations, and communication channels.

An example of such a language is a Bach C language disclosed in "Bach: Environment for LSI Design with C Language", The 11$^{th}$ Workshop on Circuits and Systems in Karuizawa, Apr. 20–21, 1998, and "Hardware Complier Bach", TECHNICAL REPORT OF IEICE CRSY97-87 (1997-10). FIG. 15 shows an example of the C language for hardware description. In this example, the following behavior is described.

As shown in FIG. 15, the third line of the behavioral description is the declaration of an int type synchronous communication channel ch.

"Par" on the sixth line is of a par sentence, which explicitly indicates parallel operations. Here, the sentence indicates that two blocks therein are operated in parallel.

The seventh line describes a first thread operation, indicating that a data communication command "send" is used to send a value 10 to the communication channel ch.

The eighth line describes the next thread operation, indicating that a data communication command "receive" is used to receive data from the communication channel ch, and substitute the received data into a variable x.

The tenth line indicates that after the par sentence on lines 6–9 is executed, the content of the variable x is output as an integer type decimal number to "stdout".

Next, the processes of high-level synthesis will be explained based on an exemplary high-level synthesis as proposed by Japanese Laid-Open Publication No. 10-116302, entitled "Method for Designing Integrated Circuit and Integrated Circuit Designed by the Method". The flow of high-level synthesis is roughly divided into four stages: (N1) to (N4). The explanation will be carried out with reference to the function blocks in FIG. 16.

(N1) A behavioral description which describes an algorithm of the processing behavior of a circuit is analyzed.

(N2) The processing behavior is divided into threads which are asynchronously operated in parallel.

(N3) For each thread, the following processes (N3a) to (N3f) are carried out.

(N3a) Synthesis of CDFG

CDFG (control data flow graph) is a graph representing dependence relationships between computations in terms of execution order. In a CDFG, computations, inputs and outputs are represented by nodes, and data dependence relationships are represented by directed branches.

(N3b) Scheduling

A time corresponding to a clock, called a step, is allocated successively to each of the computations, the inputs and the outputs in the CDFG.

(N3c) Allocation

Computation units, registers, and input and output pins required for execution of the scheduled CDFG are generated. The computation units are allocated to the computations in the CDFG. The registers are allocated to data dependence branches across clock borders. The input and output pins are allocated to the input and the outputs.

(N3d) Generation of Data Path

Data paths corresponding to the respective data dependence relationship branches in the CDFG are generated.

(N3e) Generation of Controller

A controller for controlling the computation units, registers and multiplexers generated during the allocation and the generation of the data paths is generated.

(N3f) Generation of RT Level Circuit

A circuit description of the circuit generated by the above-described processes is generated using a hardware description language, such as VHDL [VHSIC (Very High Speed Integrated Circuit) Hardware Description Language], and the like.

(N4) RT level circuits each for the respective threads (partial circuit) are integrated together into a single RT level circuit.

Next, the parallel operation and the communication in the high-level synthesis will be explained.

Hereinafter, it is assumed that in communication using synchronous channels (hereinafter referred to as synchronous channel communication), data is transferred after both a sender-end thread (hereinafter referred to as a send-thread) and a receiver-end thread (hereinafter referred to as a receive-thread) are in a state of readiness for communication.

As one method for realizing synchronous channel communication, a circuit configuration as shown in FIG. 17, which employs a handshake control signal, may be used. In such a circuit configuration, a send-thread circuit has the following ports. An (I) in the name of each port of the circuit indicates that the port is an input port, while an (O) indicates that the port is an output port. "wtx" represents a control line port for a send request signal (or a send completion signal) to a receiver end. "wrx" represents a control line port for a receive request signal (or a receive completion signal) from a receiver end. "wdata" represents a data line port at a sender end.

On the other hand, a receive-thread circuit has the following ports. An (I) in the name of each port of the circuit indicates that the port is an input port, while an (O) indicates that the port is an output port. "rrx" represents a control line port for a receive request signal (or a receive completion signal) to a receiver end. "rtx" represents a control line port for a send request signal (or a send completion signal) from a receiver end. "rdata" represents a data line port at a receiver end.

FIG. 18 shows an exemplary timing chart of data transfer in the circuit configuration. It should be noted that the voltage of each control line in the initial state is assumed to be at a "LOW" level.

It is assumed that a "send command" is first executed, and thereafter, a "receive command" is executed. As shown in FIG. 18, for example, a send-thread (thread 1) executes a "send command" in a clock cycle c1, and a receive-thread (thread 2) executes a "receive command" in a clock cycle c3.

The send-thread outputs data d1 to the data line port "wdata" in the clock cycle c1, and causes the voltage of the control line port "wtx(O)" to be at a "HIGH" level. Further, the send-thread waits until the voltage of the control line port "wrx(I)" goes "HIGH". When the voltage of the control line port "wrx(I)" goes "HIGH", the send thread causes the voltage of the control line port "wtx(O)" to go "LOW" and ends the data output to the data line port "wdata" at the next clock cycle (c4).

On the other hand, the receive-thread causes the voltage of the control line port "rrx(O)" to be at the "HIGH" level in the clock cycle c3. Here, since the voltage of the control line port "rtx(I)" is at the "HIGH" level, the receive-thread references the data d1 at the data line port "rdata" and causes the voltage of the control line port "rrx(O)" to go "LOW" at the next clock cycle c4. Thus, data communication is ended.

Next, it is assumed that a "receive command" is first executed, and thereafter, a "send command" is executed.

As shown in FIG. 18, for example, the receive-thread executes the "receive command" in a clock cycle c7, while the send-thread executes the "send command" in a clock cycle c9.

The receive-thread causes the voltage of the control line port "rrx(O)" to be at the "HIGH" level in the clock cycle c7. Further, the receive-thread waits until the voltage of the control line port "rtx(I)" goes "HIGH". When the voltage of the control line port "rtx(I)" goes "HIGH", the receive-thread references data d2 of the data line port "rdata" and causes the voltage of the control line port "rrx(O)" to go "LOW" in a clock cycle c10.

The send-thread outputs the data d2 to the data line port "wdata" and causes the voltage of the control line port "wtx(O)" to go "HIGH" in the clock cycle c9. Here, since the voltage of the control line port "rrx(O)" is at the "HIGH" level, the send-thread causes the voltage of the control line port "wtx(O)" to go "LOW" and ends data output to the data line port "wdata" at the next clock cycle c10. Thus, data communication is ended.

In this manner, after the send-thread causes the voltage of the control line port "wtx(O)" to go "HIGH", when the voltage of the control line port "wrx(I)" goes "HIGH", the "send command" is ended. After the receive-thread causes the voltage of the control line port "rrx(O)" to go "HIGH", when the voltage of the control line port "rtx(I)" goes "HIGH", the "receive command" is ended. When these "send command" and "receive command" are executed in the same clock cycle Cn, data communication is ended in a clock cycle Cn+1.

In the field of consumer-oriented portable devices or communication devices, there has been a demand for elongation of the life of a battery, improvement of the reliability of LSI, a reduction in heat generation, cost reduction in cooling and packaging of LSI, and the like. To meet the demands, the power consumption of a circuit has to be lowered.

Generally, the power consumption P of a CMOS logic circuit is represented as:

$$P = \alpha \cdot C \cdot V^2 \cdot f$$

where $\alpha$ indicates the switching rate of the circuit, C indicates the load capacitance thereof, V indicates the operating voltage thereof, and f indicates the operating frequency thereof.

According to the expression, a decrease in the switching rate can lead to a reduction in the power consumption.

Generally, a synthesized RT level circuit is composed of a plurality of partial circuits corresponding to threads which are asynchronously operated in parallel, and is always driven by a clock.

On the other hand, when synchronous channel communication is carried out between threads, even if one of a send-thread or a receive-thread starts data communication, one of the methods may wait until the other is ready. For example, in the clock cycles c2 and c3 shown in FIG. 18 the send-thread is in a wait state, while in the clock cycles c8 and c9 the receive-thread is in a wait state. When the thread is in a wait state, even if the corresponding partial circuit is not operated, the output of the circuit is not affected.

However, in the above-described conventional configuration, even when a certain thread is in a wait state, a clock is always supplied. As a result, although the output of the circuit is not affected, power is uselessly consumed by the supply of a clock in a partial circuit.

SUMMARY OF THE INVENTION

According to one aspect of the present invention, a high-level synthesis apparatus for synthesizing a register transfer level logic circuit from a behavioral description describing a processing operation of the circuit, comprises a low power consumption circuit generation section for generating a low power consumption circuit which stops or inhibits circuit operations of partial circuits constituting the logic circuit only when the partial circuits are in a wait state, so to achieve low power consumption. The low power consumption circuit generation section is synthesized along with the logic circuit.

In one embodiment of this invention, the low power consumption circuit generation section generates the low power consumption circuit which stops or reduces clock supply to the partial circuits when the partial circuits are in a wait state, based on synchronous processing information extracted from behavioral description information including synchronous communication information.

According to another aspect of the present invention, a high-level synthesis method is provided for synthesizing a register transfer level logic circuit from a behavioral description describing a processing operation of the logic circuit so as to construct a desired logic circuit, and producing the synthesized logic circuit. The method comprises the step of synthesizing, along with the logic circuit, a low power consumption circuit which stops or inhibits circuit operations of partial circuits constituting the logic circuit only when the partial circuits are in a wait state, so to achieve low power consumption.

In one embodiment of this invention, the synthesized low power consumption circuit stops or reduces the operations of partial circuits by stopping or reducing clock supply to the partial circuits.

In one embodiment of this invention, the synthesized low power consumption circuit controls the clock supply using a signal indicating the wait state.

In one embodiment of this invention, the synthesized low power consumption circuit stops or inhibits the operations of the partial circuits when a data sender-end circuit or a data receiver-end circuit is in a wait state during data transfer between the partial circuits.

In one embodiment of this invention, the synthesized low power consumption circuit generates a signal indicating the wait state of the partial circuits using a control signal for synchronous communication, and drives the partial circuits using a gated clock generated using the signal indicating the wait state of the partial circuits, so as to achieve low power consumption.

In one embodiment of the synthesizing step is carried out based on synchronous processing information extracted from behavioral description information including synchronous communication information, and the synthesized low power consumption circuit stops or reduces the operations of partial circuits by stopping or reducing clock supply to the partial circuits.

In one embodiment of this invention, the high-level synthesis method further comprises the steps of generating a signal for each partial circuit indicating that the partial circuit is in a wait state based on synchronous processing information extracted from behavioral description information including the synchronous communication information, and generating a gated clock for each partial circuit using the signal. The synthesized low power consumption circuit drives the partial circuit using the generated gated clock, and stops the output of the gated clock supplied to the partial circuit when the partial circuit is in a wait state.

According to another aspect of the present invention, a method is provided for producing a logic circuit, in which the above-described high-level synthesis method is used to design the logic circuit.

According to another aspect of the present invention, a computer readable recording medium comprises a control program for executing the above-described high-level synthesis method.

Thus, the invention described herein makes possible the advantages of providing a high-level synthesis apparatus capable of generating a low power consumption circuit configuration in which wasted power consumption when a thread is in a wait state can be reduced, a high-level synthesis method using the high-level synthesis apparatus, a method for producing a logic circuit using the high-level synthesis method, and a computer readable recording medium recording a control program for executing the high-level synthesis method.

These and other advantages of the present invention will become apparent to those skilled in the art upon reading and understanding the following detailed description with reference to the accompanying figures.

BRIEF DESCRIPTION OF THE DRAWINGS

FIG. 2A is a diagram showing an exemplary behavioral description.

FIG. 2B is a diagram showing synchronous processing information on synchronous channels.

DESCRIPTION OF THE PREFERRED EMBODIMENTS

Hereinafter, a high-level synthesis apparatus and method according to the present invention will be described with reference to the accompanying drawings.

Figure 1:
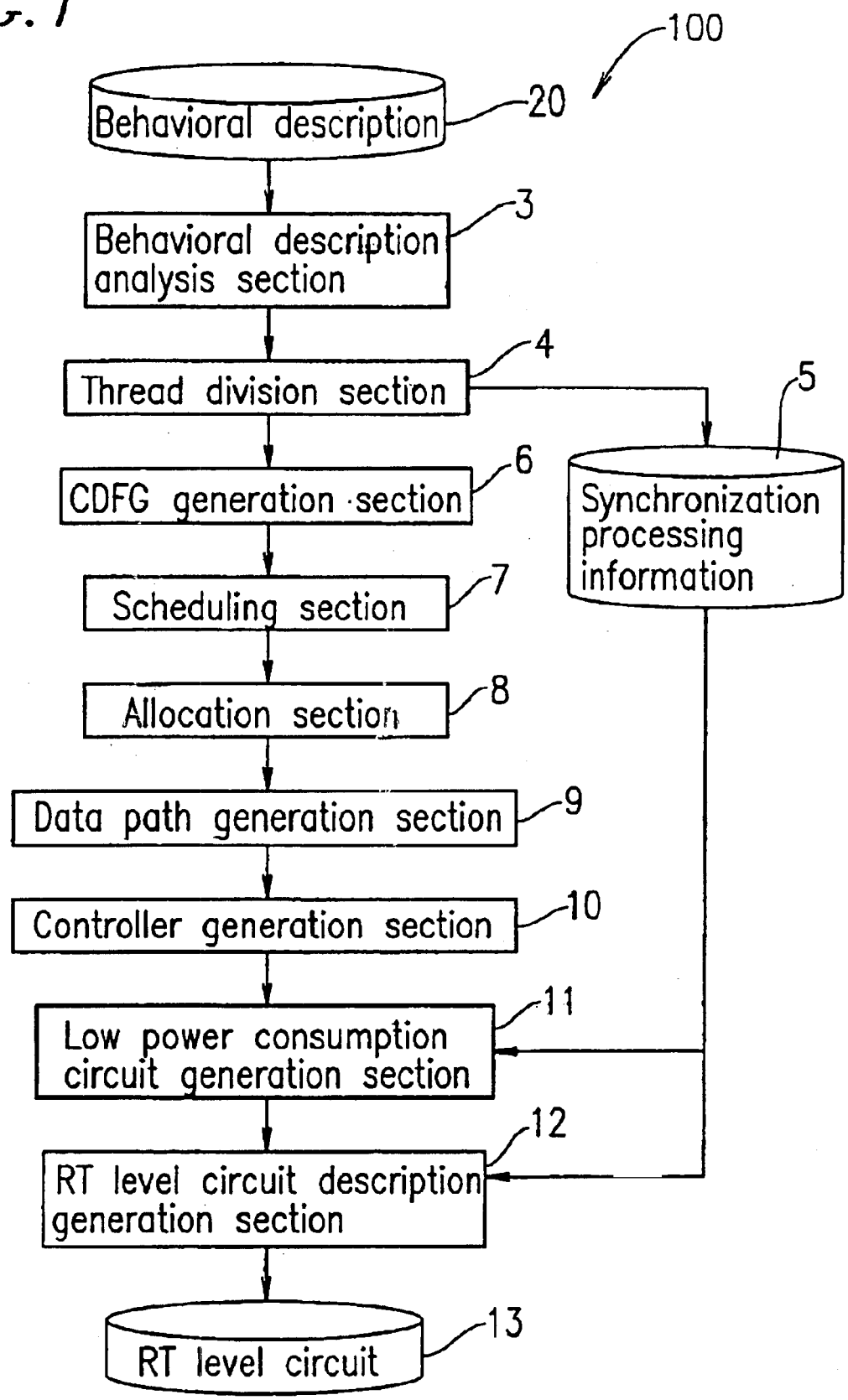
FIG. 1 is a block diagram of a configuration of a high-level synthesis apparatus according to an example of the present invention, showing major functional sections thereof.

FIG. 1 is a block diagram of a configuration of a high-level synthesis apparatus according to an example of the present invention, showing major functional sections thereof. In FIG. 1, a high-level synthesis apparatus 100 comprises a behavioral description storage section 20, a behavioral description analysis section 3, a thread division section 4, a synchronous processing information storage section 5, a CDFG (control data flow graph) generation section 6, a scheduling section 7, an allocation section 8, a data path generation section 9, a controller generation section 10, a low power consumption circuit generation section 11, a RT level circuit description generation section 12, and a RT level circuit storage section 13.

The behavioral description storage section 20 stores a behavioral description (e.g., FIG. 2A) of a logic circuit (LSI digital circuit) in which an algorithm for a high-level synthesis processing method is described.

The behavioral description analysis section 3 extracts and analyzes a behavioral description as shown in FIG. 2A, which describes an algorithm for the processing operation of a circuit, to extract synchronous processing information in the behavioral description. The synchronous processing information is information on a process requiring synchronization between threads. For example, such information relates to communication using a synchronous channel. Specifically, the synchronous processing information includes not only synchronous processing information for a synchronous channel, but also information on other processes. The information on other processes includes, for example, information on a process for synchronization in which a plurality of blocks in a Par sentence, which operate in parallel, start processing simultaneously, or a next process in the Par sentence is started after all of the blocks are ended.

The thread division section 4 traces a syntax tree and divides the tree into a plurality of threads which are asynchronously operated in parallel, and generates a list of pieces of information on synchronous channels via which the threads carry out a "send" operation, and a list of pieces of information on synchronous channels via which the threads carry out a "receive" operation. It should be noted that in the behavioral description in FIG. 2A, lines 7–14 corresponds to a thread 1 and lines 15–19 corresponds to a thread 2.

The synchronous processing information storage section 5 stores information on a synchronous process relating to a synchronous channel as shown in FIG. 2B generated for each thread by the thread division section 4 or other synchronous processing information.

Figure 3:
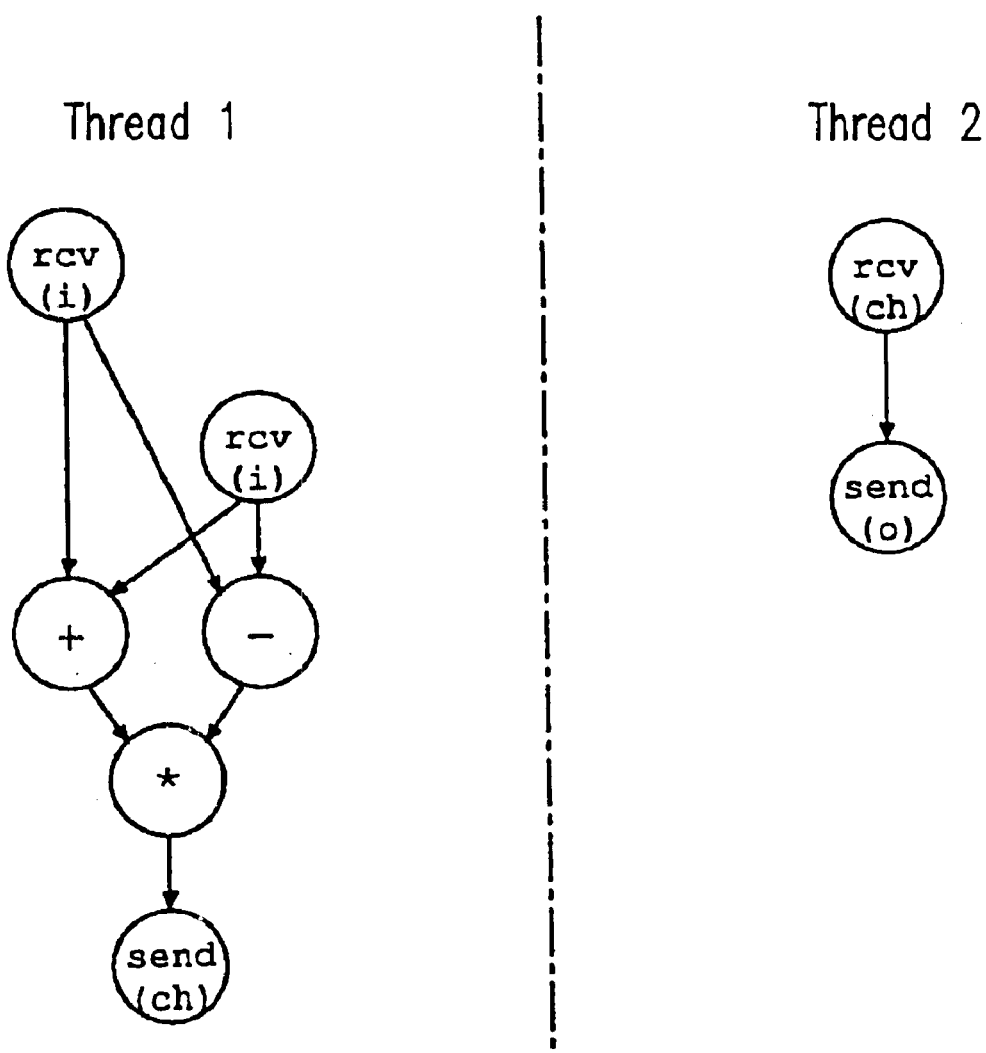
FIG. 3 is a schematic diagram showing a result of CDFG generation by the high-level synthesis apparatus of FIG. 1.

The CDFG generation section 6 generates a CDFG (control data flow graph) as shown in FIG. 3, for example, based on the behavioral description in FIG. 2A. The details thereof will be described below.

Figure 4:
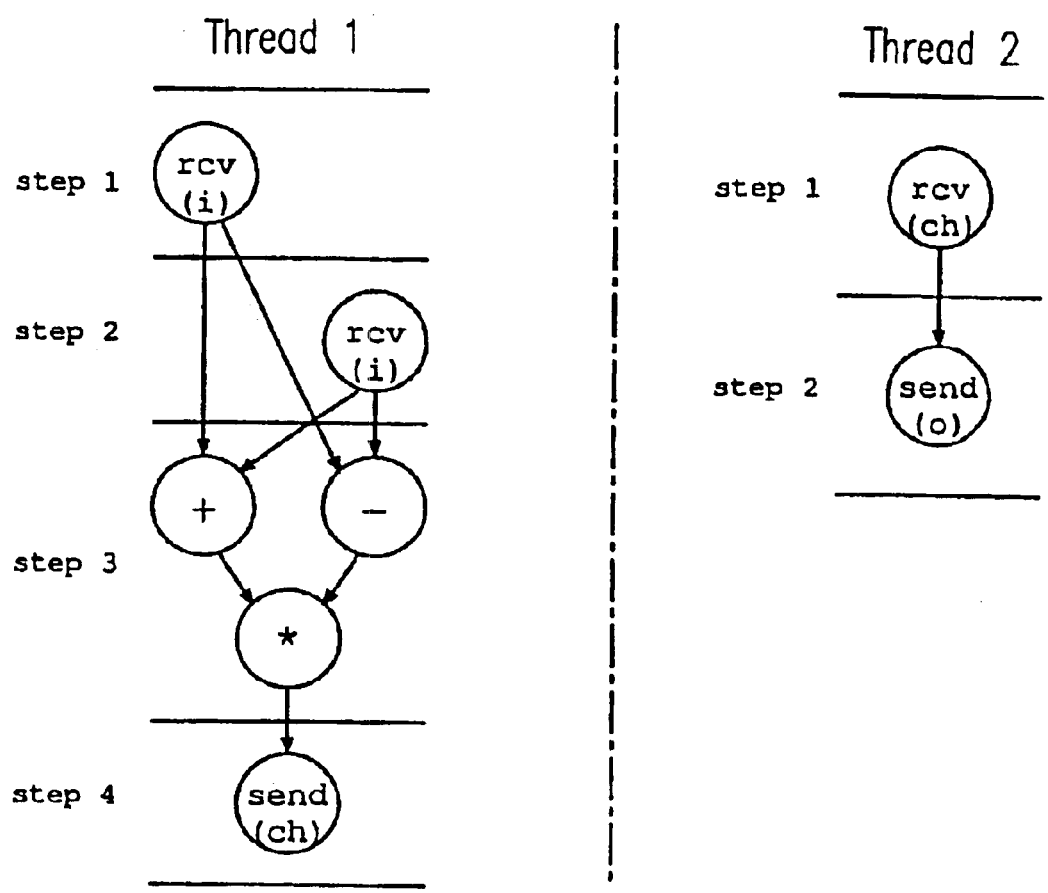
FIG. 4 is a schematic diagram showing a result of scheduling by the high-level synthesis apparatus of FIG. 1.

The scheduling section 7 generates a schedule in which a CDFG is divided into a plurality of steps as shown in FIG. 4, for example.

Figure 5:
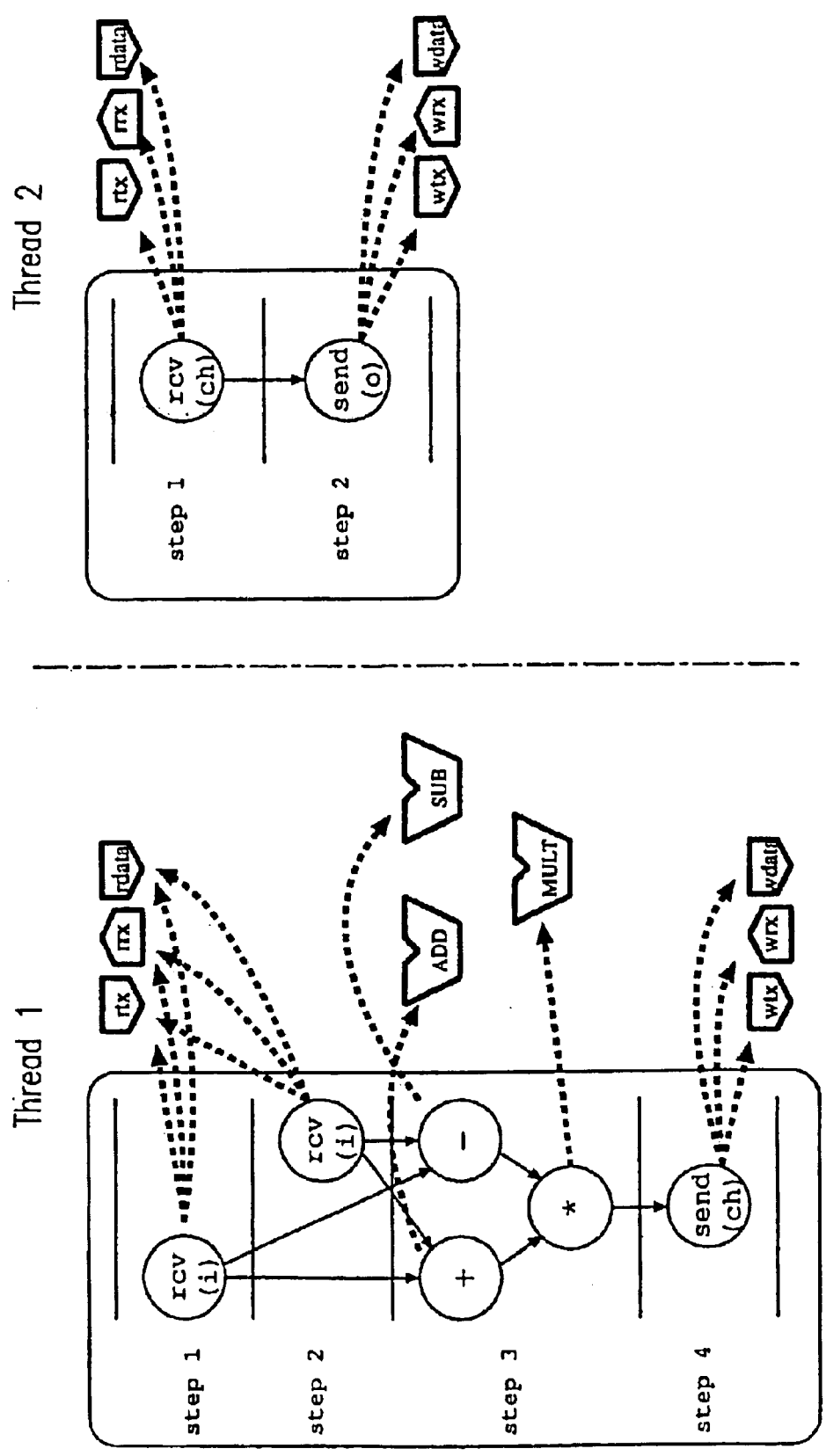
FIG. 5 is a schematic diagram showing a result of allocation (computation unit) by the high-level synthesis apparatus of FIG. 1.
Figure 6:
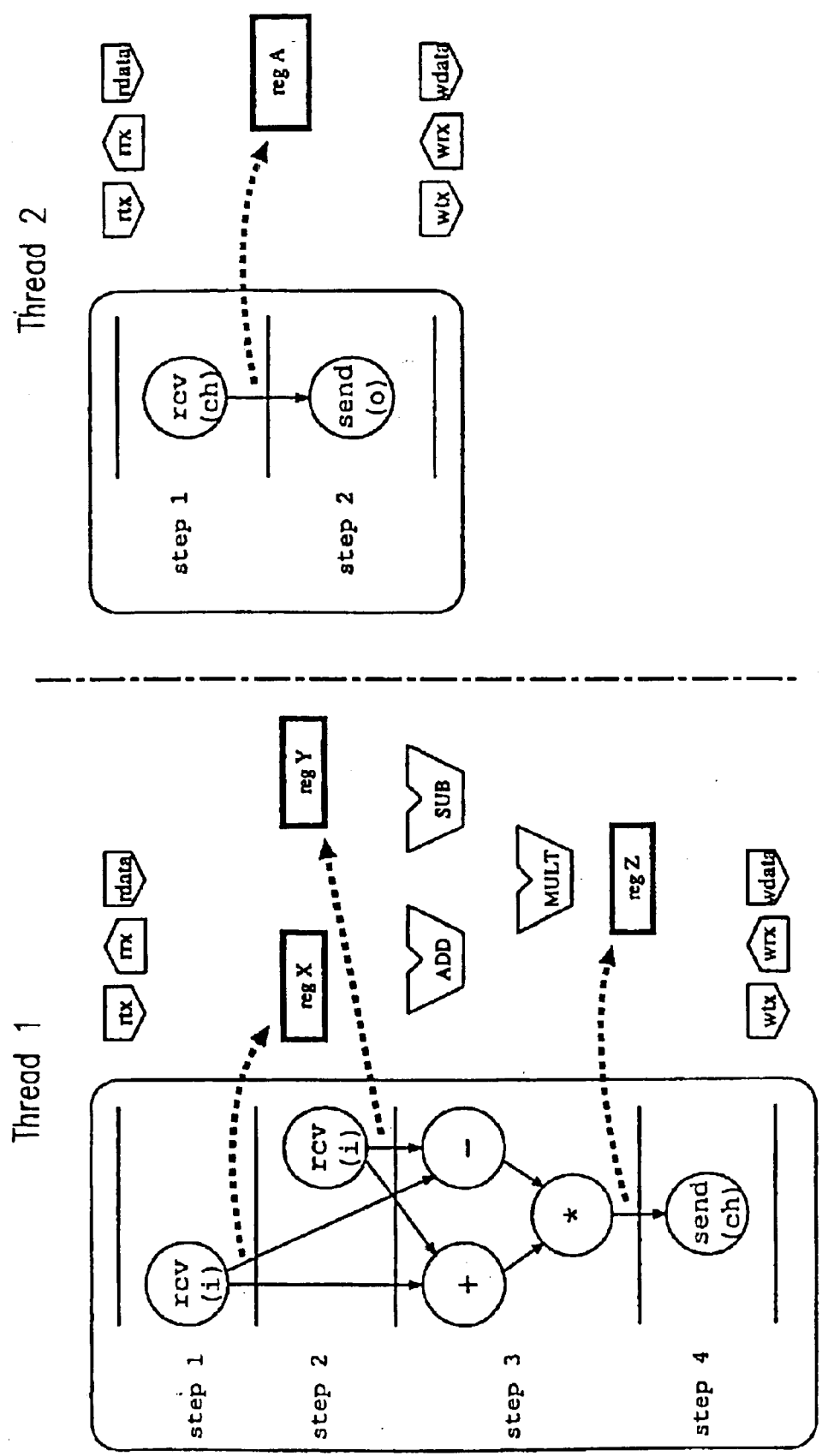
FIG. 6 is a schematic diagram showing a result of allocation (register) by the high-level synthesis apparatus of FIG. 1.

The allocation section 8 allocates computation units as shown in FIG. 5 and registers as shown in FIG. 6 to a CDFG, as described below.

Figure 7:
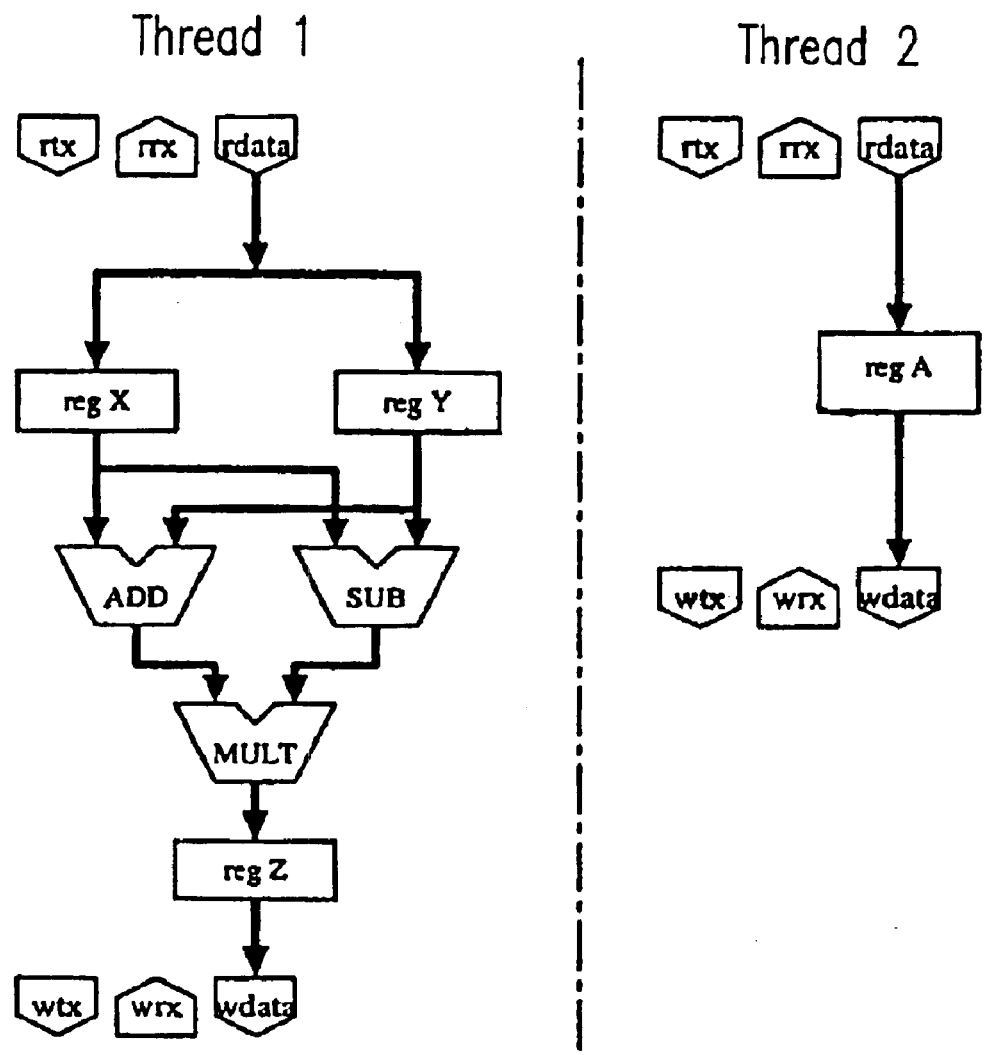
FIG. 7 is a schematic diagram showing a result of generation of data paths by the high-level synthesis apparatus of FIG. 1.

The data path generation section 9 generates (connects) data buses (data paths) between circuit elements allocated with the computation units or registers as shown with thick lines in FIG. 7.

Figure 8:
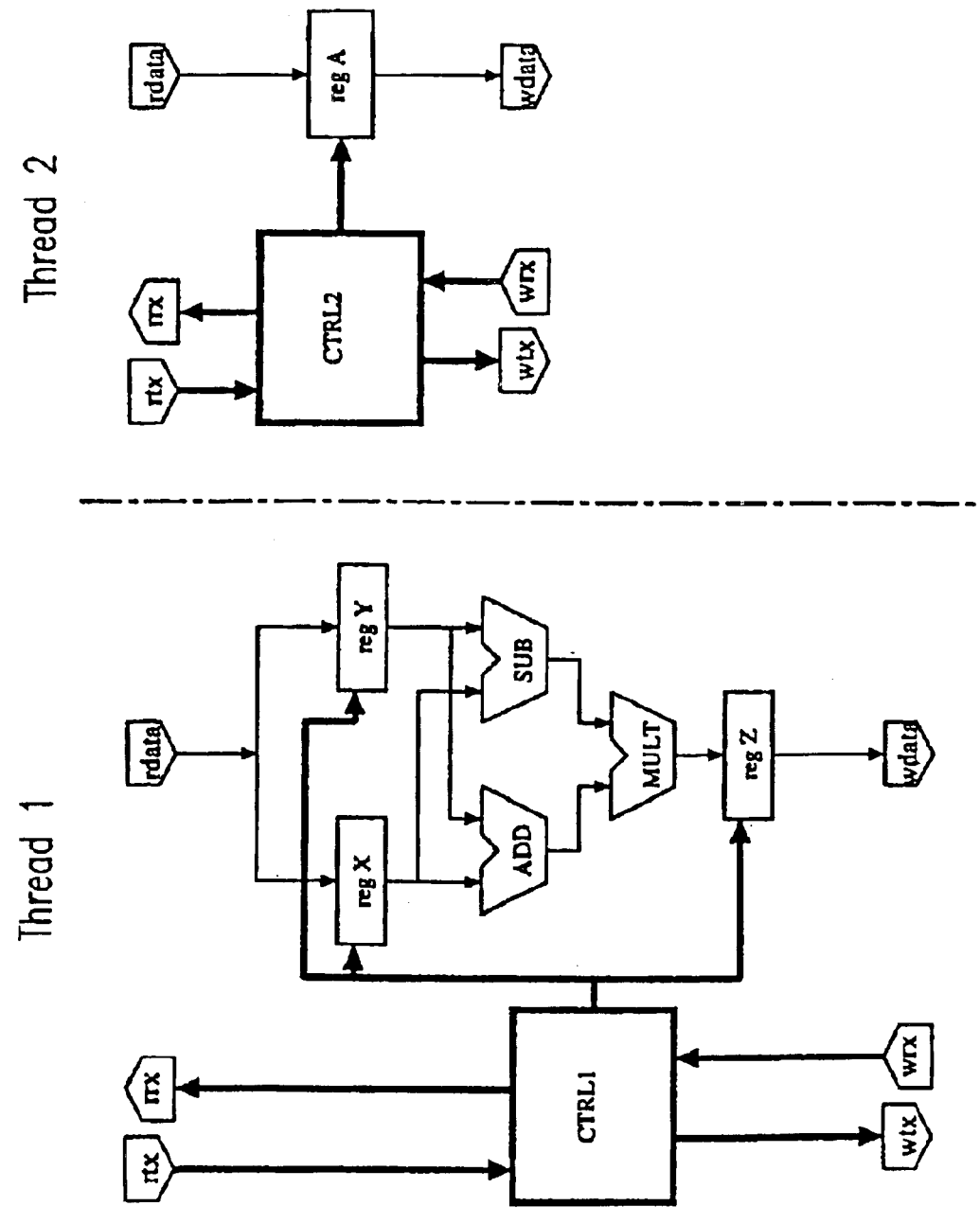
FIG. 8 is a schematic diagram showing a result of generation of a controller by the high-level synthesis apparatus of FIG. 1.

The controller generation section 10 adds a controller a circuit having data bus connections, as shown with thick lines in FIG. 8. The controller is connected to control lines.

Figure 9A:
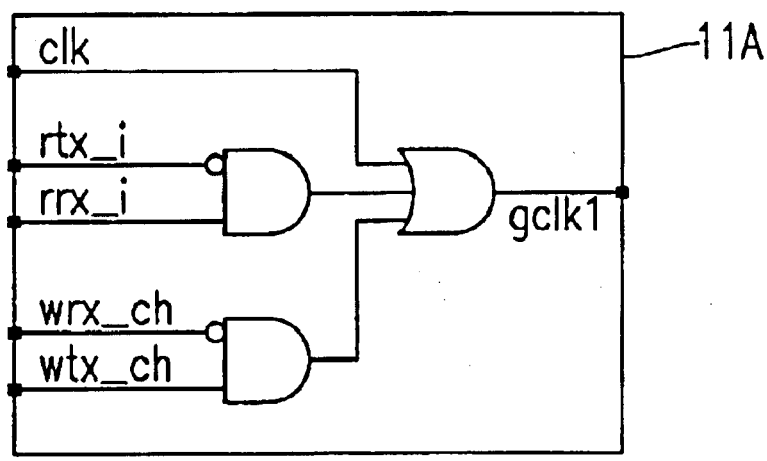
FIG. 9A is a schematic diagram showing a result of generation of a low power consumption circuit corresponding to a thread 1 by the high-level synthesis apparatus of FIG. 1.
Figure 9B:
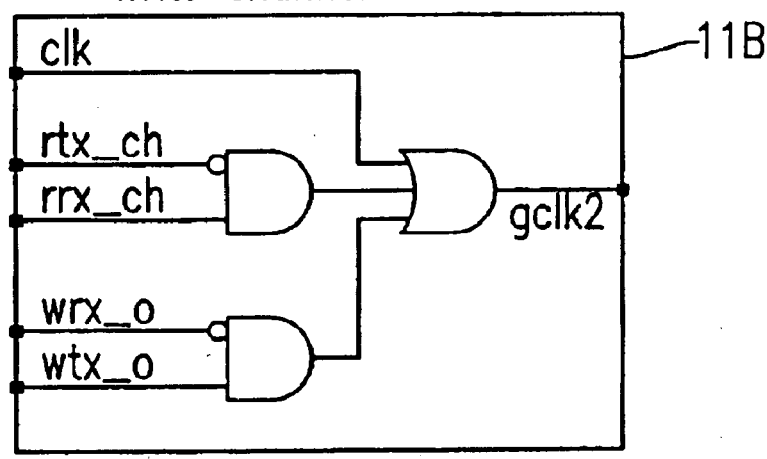
FIG. 9B is a schematic diagram showing a result of generation of a low power consumption circuit corresponding to a thread 2 by the high-level synthesis apparatus of FIG. 1.

The low power consumption circuit generation section 11 generates low power consumption circuits 11A and 11B, for example, as shown in FIGS. 9A and 9B, based on the synchronous processing information relating to the synchronous channels stored in the synchronous processing information storage section 5 as shown in FIG. 2B. The low power consumption circuits 11A and 11B stop supplying clock to a partial circuit for each thread when the thread is in a wait state.

Figure 10:
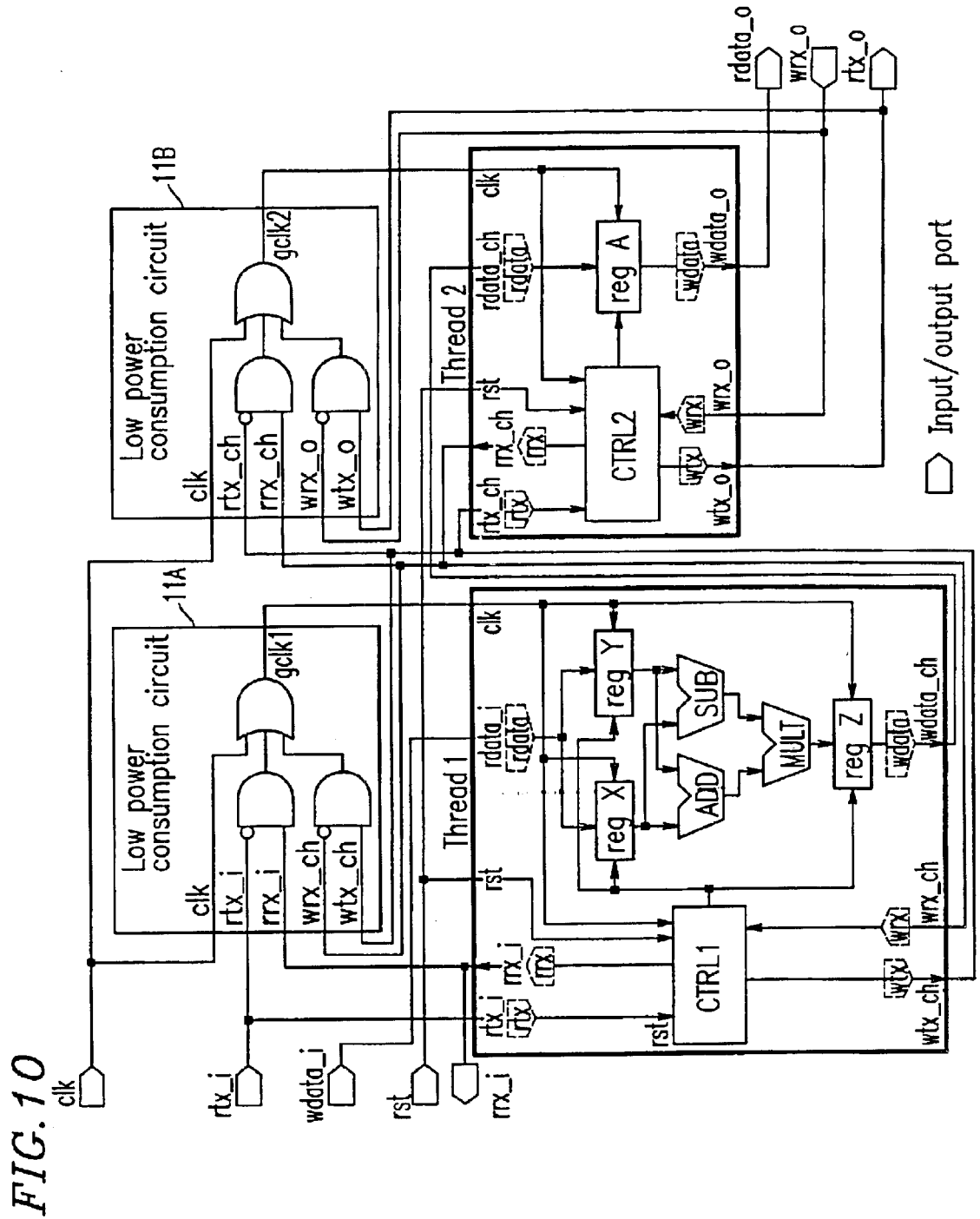
FIG. 10 is a schematic diagram showing a result of generation of a RT level circuit by the high-level synthesis apparatus of FIG. 1.

The RT level circuit description generation section 12 (RT level circuit generation section) connects partial circuits (threads 1 and 2) and the low power consumption circuits 11A and 11B, for example, in FIG. 10 to generate a RT level circuit.

The RT level circuit storage section 13 stores generated RT level circuit information.

Figure 11:
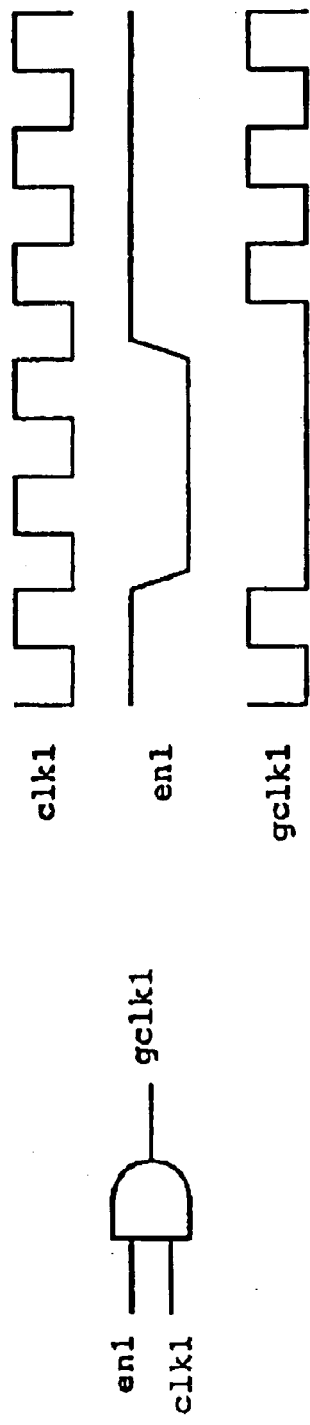
FIG. 11 is a diagram showing an exemplary gated clock method.
Figure 11:
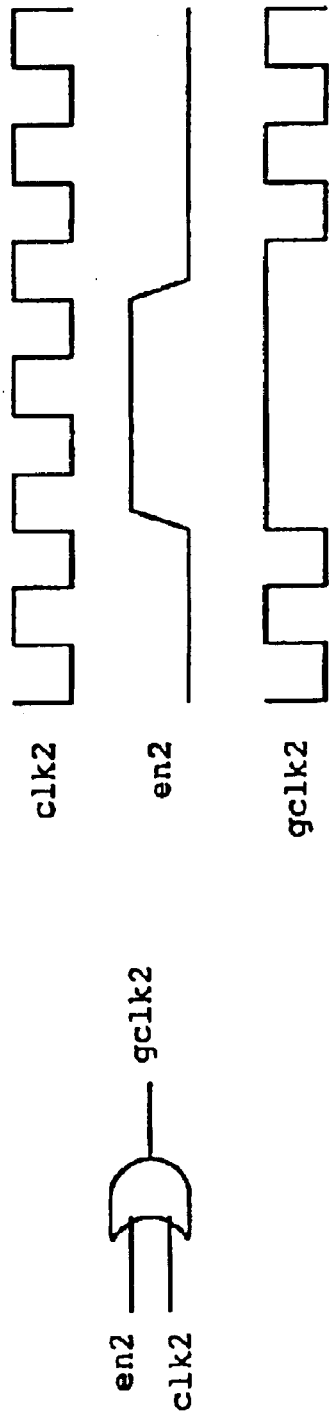

Here, as an exemplary method for controlling the clock signals to be supplied to a circuit, a gated clock method using AND logic elements or OR logic elements will be described. In this method, as shown in FIG. 11, by changing a control signal (enable signal), clock pulses are output in a desired timing. The gated clock method may be used as an exemplary method for stopping the operation of a partial circuit. Other methods may be employed to stop the operation of a partial circuit.

Figure 12:
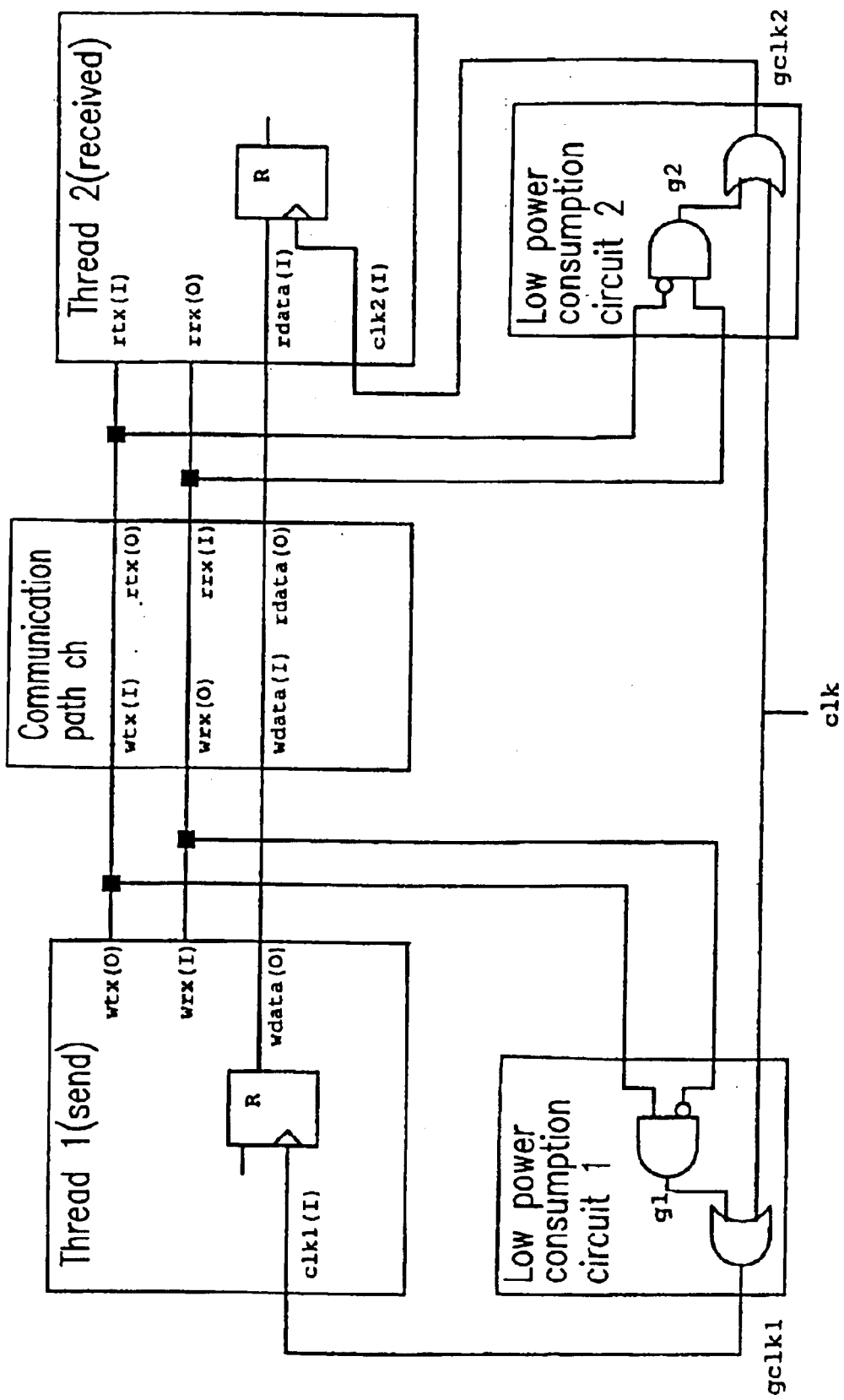
FIG. 12 is a circuit diagram when the low power consumption circuit of the present invention is applied to an exemplary synchronous communication shown in FIG. 17.
Figure 13:
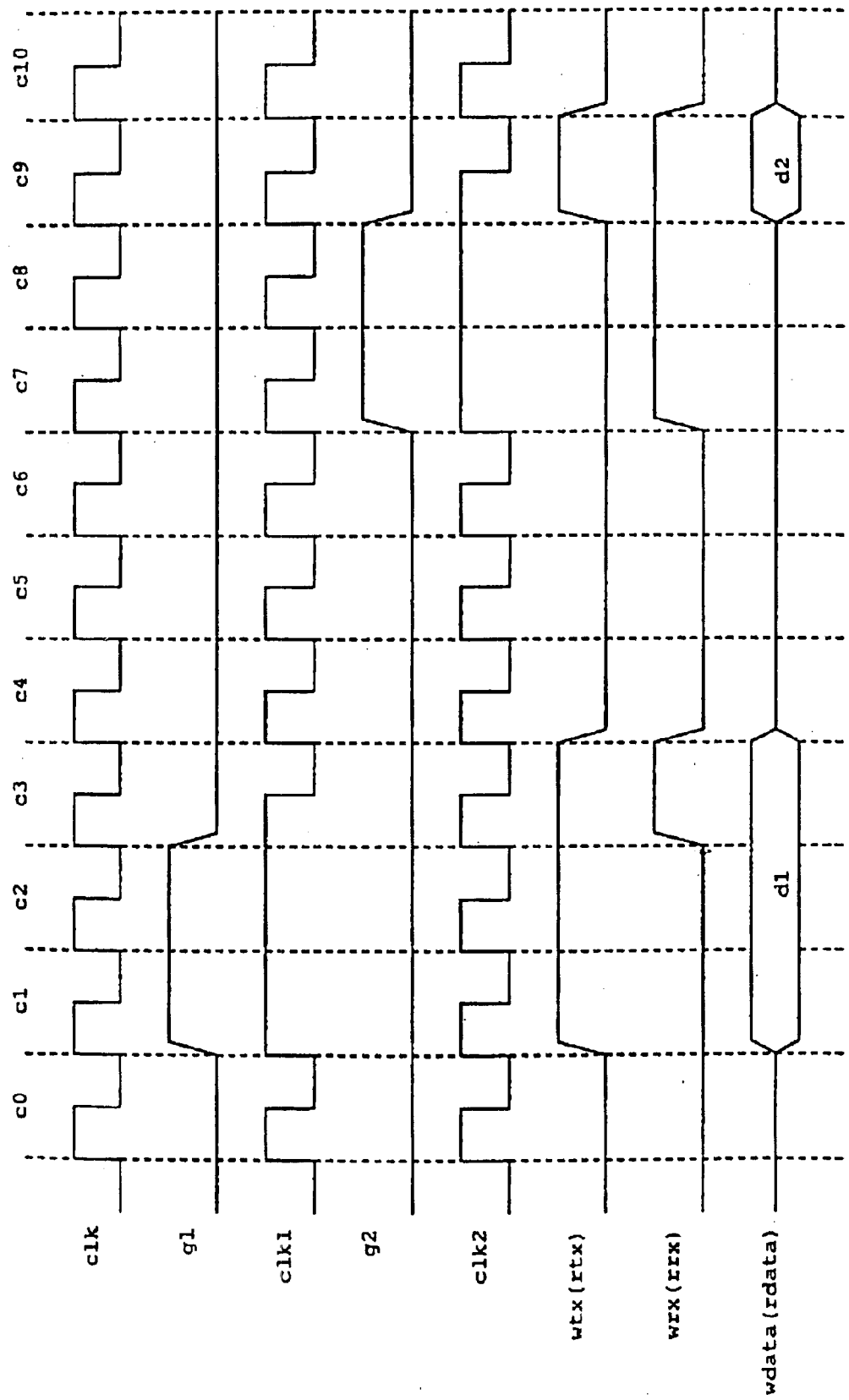
FIG. 13 is a timing chart diagram showing an example including the low power consumption circuit of FIG. 12.
Figure 17:
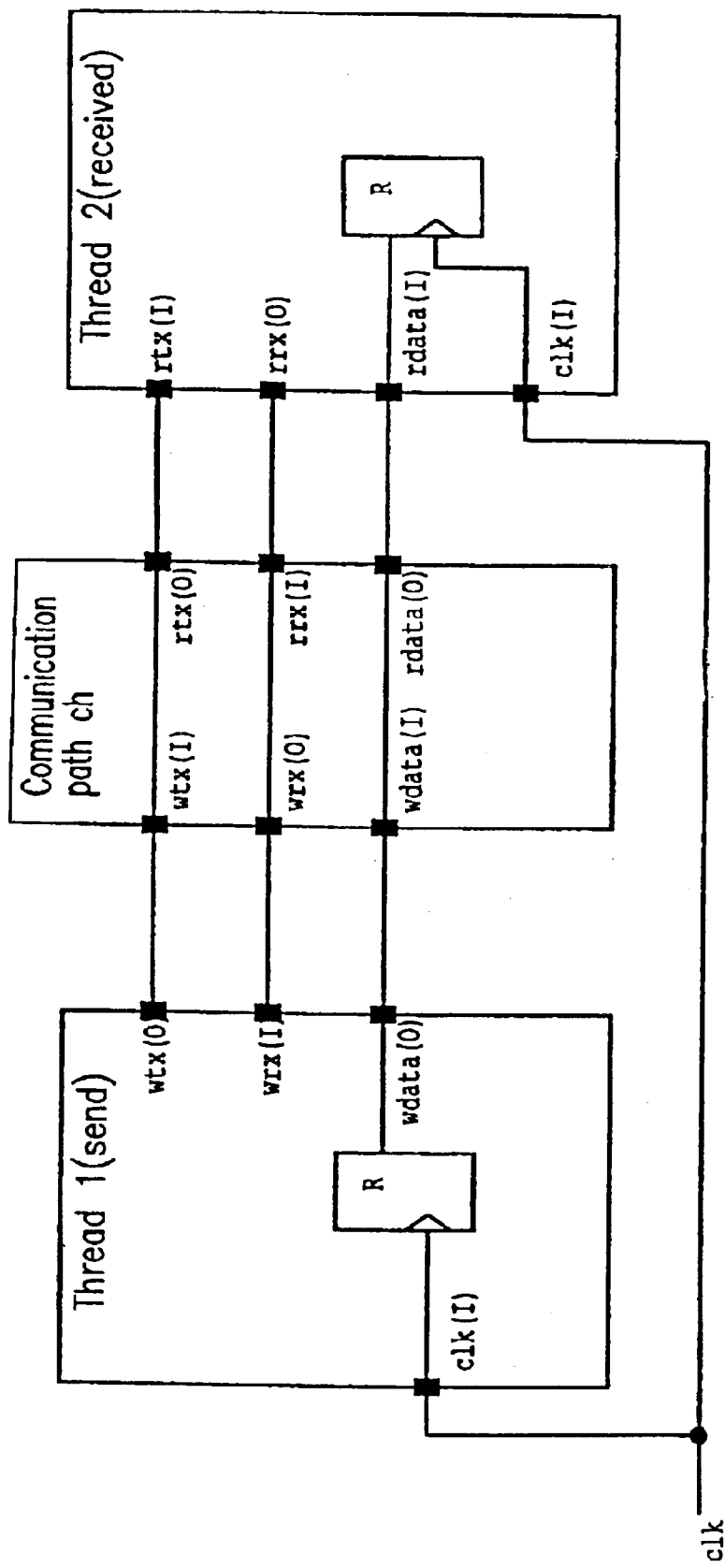
FIG. 17 is a schematic circuit diagram showing an exemplary method for realizing synchronous communication.
Figure 18:
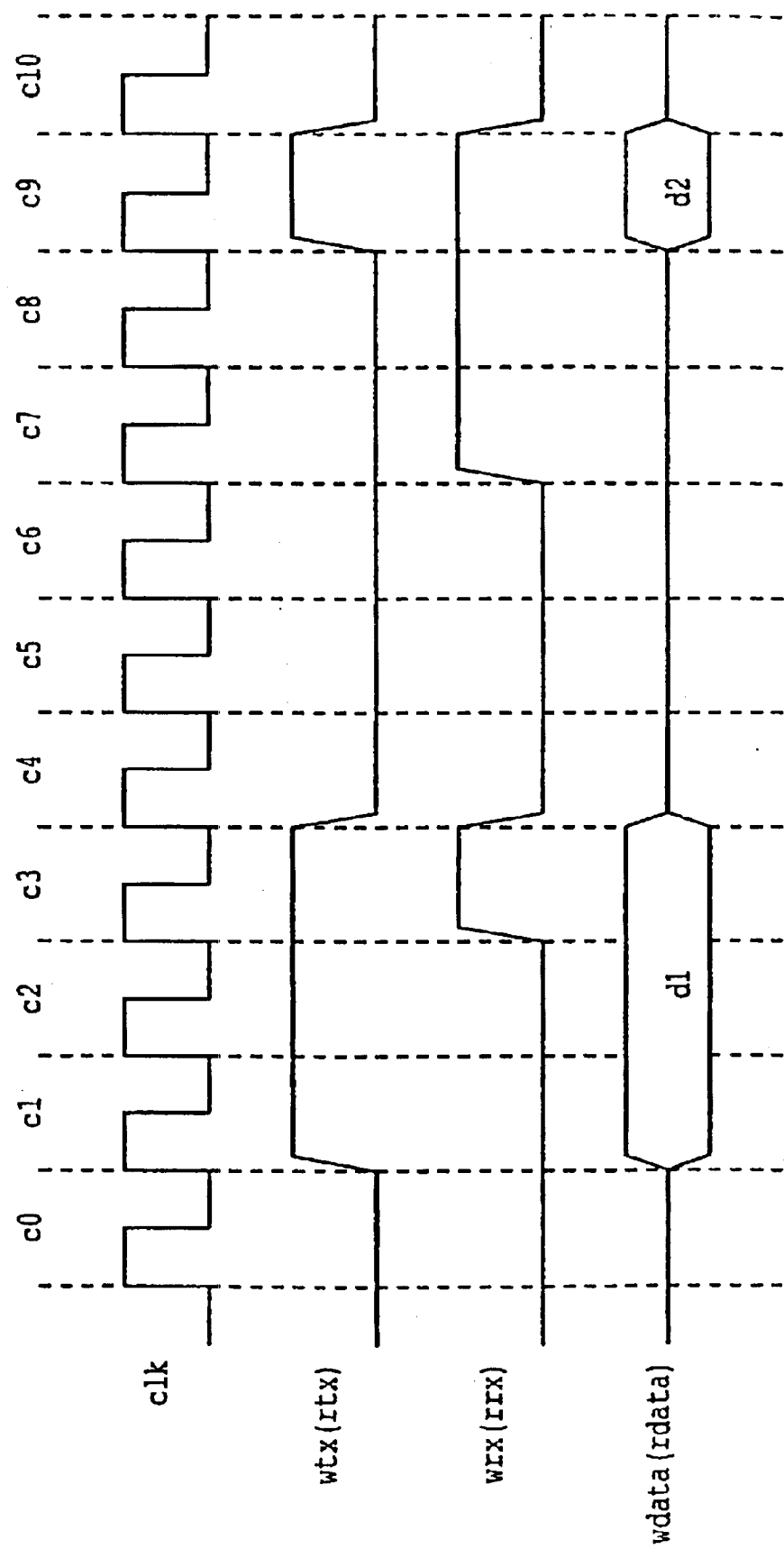
FIG. 18 is a timing chart showing an exemplary operation of the synchronous communication of FIG. 17.

For example, when the gated clock method is applied to a circuit shown in FIG. 17, the circuit will be configured as shown in FIG. 12. A timing chart of this circuit is as shown in FIG. 13. As shown in the timing chart of FIG. 13, a clock signal to the thread 1 (send) is stopped in clock cycles c2 and c3, while a clock signal to the thread 2 (receive) is stopped in clock cycles c8 and c9. Therefore, power consumption caused by clock signals can be reduced to 9/11.

Thus, in the present invention, the generated low power consumption circuit is used to stop clock supply to a partial circuit when a thread is in a wait state (maintained at the high or low level). As a result, the switching rate of the partial circuit is reduced, thereby achieving low power consumption.

An operation of the above-described configuration will be described in detail.

Firstly, it is assumed that a behavioral description in which an algorithm for a high-level synthesis process is described as shown in FIG. 2A is given. In this case, the behavioral description analysis section 3 analyzes a predetermined behavioral description obtained from the behavioral description storage section 20. The thread division section 4 allocates a first block in the par sentence of the behavioral description in FIG. 2A to the thread 1, and a second block to the thread 2. Synchronous channels accessed by threads 1 and 2 are as shown in FIG. 2B (Table 1), for example. Information on the synchronous channels is stored in the synchronous processing information storage section 5.

Next, the CDFG generation section 6 generates a CDFG (control data flow graph). For example, based on the behavioral description of FIG. 2A, a CDFG (control data flow graph) as shown in FIG. 3 is generated, in which input from or output to a communication channel, such as "send" or "receive (rcv)" or the like, various computations, such as addition "+", subtraction "−" multiplication "×", and the like are represented by nodes, and a data dependence relationship between each node is represented by directed branchs.

Further, the scheduling section 7 carries out a scheduling process. For example, the nodes in the thread 1 in FIG. 3 are allocated to steps 1 to 4 and the nodes in the thread 2 are allocated to steps 1 and 2, whereby a schedule as shown in FIG. 4 is obtained.

Further, the allocation section 8 allocates circuit elements, such as computation units and registers, to the nodes. For the allocation of the computation units, as shown in FIG. 5, "send" or "receive (rcv)" is allocated to the communication control line ports "rtx", "rrx", "wtx" and "wrx" or the data line ports "rdata" and "wdata", while addition "+", subtraction "−" and multiplication "×" are allocated to an adder "ADD", a subtracter "SUB" and a multiplyer "MULT".

For the allocation of the registers, branches across the respective steps are allocated to registers "regx" to "regz", and "regA", resulting in allocation as shown in FIG. 6.

Further, the data path generation section 9 generates data buses (data paths). Based on the processes shown in FIGS. 5 and 6, data buses as shown with thick lines in FIG. 7 are generated.

Further, the controller generation section 10 generates control lines for controlling a controller "CTRL1", a controller "CTRL2", communication, and registers "regx" to "regz", and "regA".

Further, the low power consumption circuit generation section 11 which is a characteristic portion of the present invention generates the low power consumption circuits 11A and 11B as shown in FIGS. 9A and 9B. Here, it is assumed that clock signals supplied to the threads 1 and 2 are controlled by a gated clock method in which an OR logic gate is employed as a gating element of a clock. Based on channel in formation extracted by the thread division section 4, which is accessed by each thread 1 and 2, the following processes (1) to (3) are carried out:

(1) for a read channel "rch", using a communication control line "rrx_rch" and a control line "rtx_rch", the following logic wait_rch<=rrx_rch AND(not rtx_rch)

is generated;

(2) for a write channel "wch", using a communication control line "wtx_rch" and a control line "wrx_rch", the following logic wait_wch<=wtx_wch AND(not wrx_wch)

is generated;

(3) from the generated logics and clock "clk", gated clock "gclk" is generated. Here, when a thread includes a plurality of read channel and/or write channels, the logical OR of "wait_rch" and/or "wait_wch" corresponding to each channel is calculated.

gclk<=clk OR(wait_rch or wait_wch); from FIG. 2B (Table 1), the gated clock generation circuits 11A and 11B as shown in FIG. 9 are generated.

Finally, the RT level circuit description generation section 12 connects partial circuits in the threads 1 and 2 and the low power consumption circuits 11A and 11B mutually, resulting in a RT level circuit as shown in FIG. 10.

Figure 14:
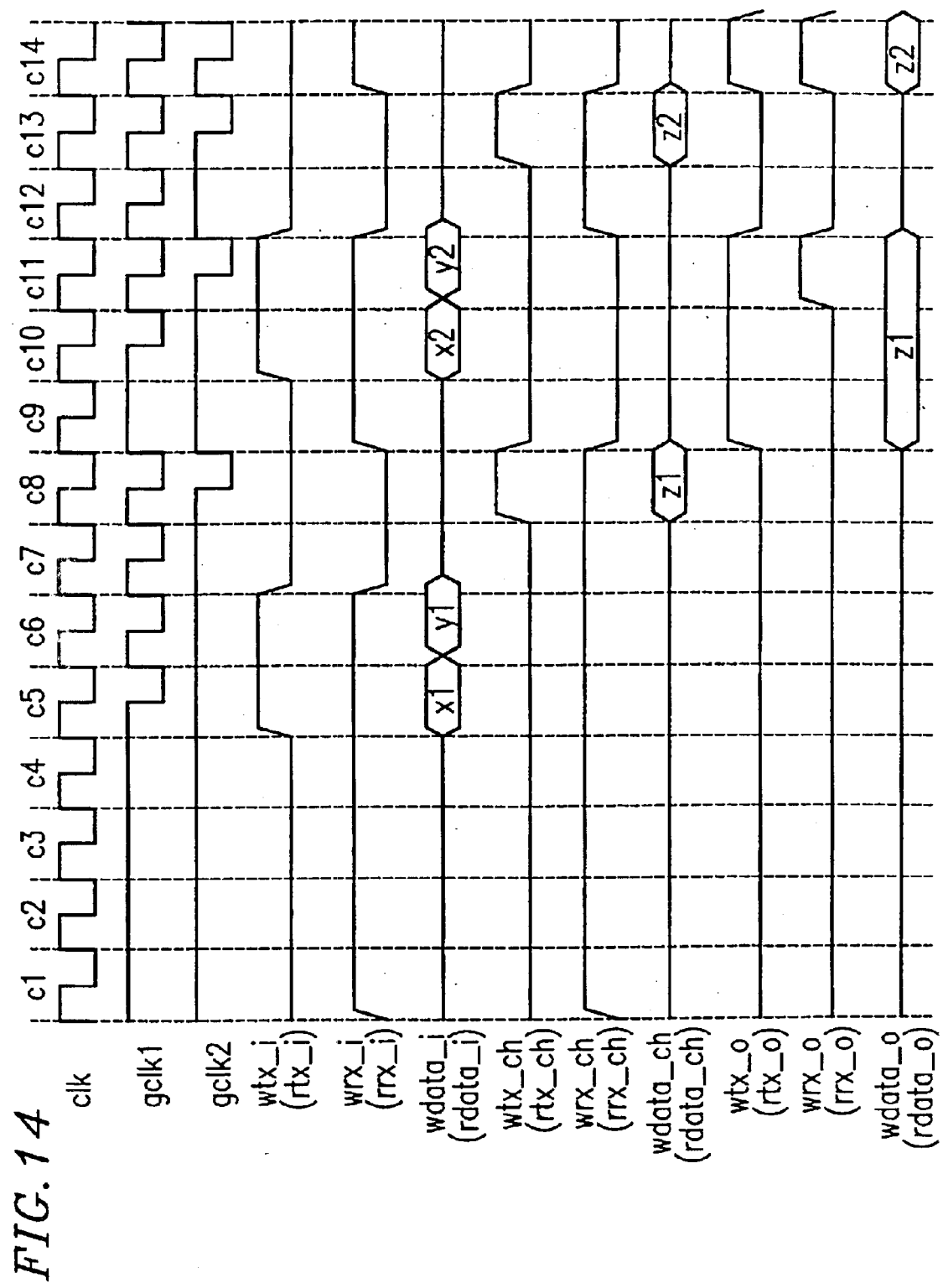
FIG. 14 is a timing chart diagram showing an exemplary operation of the RT level circuit of FIG. 10.
Figures 15, 16:
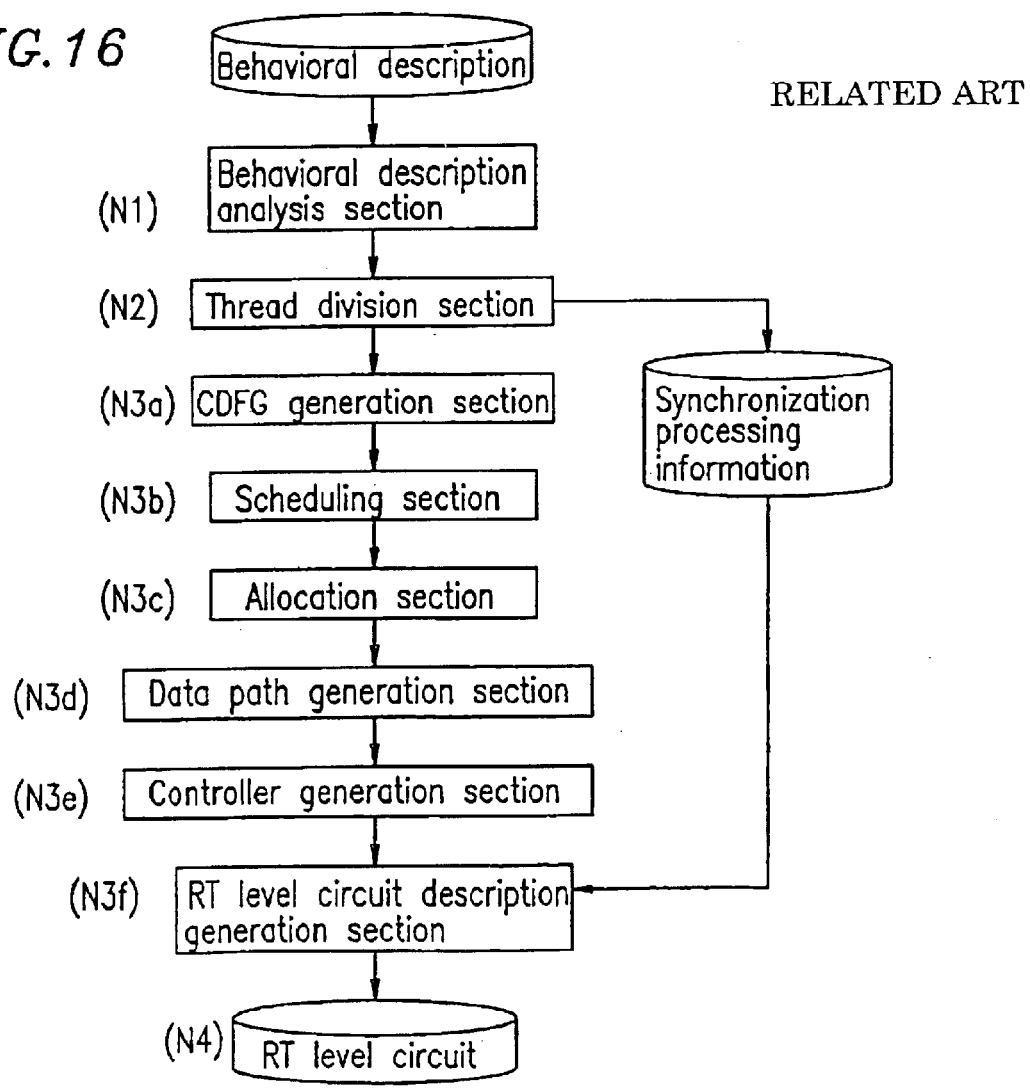
FIG. 15 is a diagram showing an exemplary behavioral description including synchronous communication.
FIG. 16 is a block diagram of a configuration of a conventional high-level synthesis apparatus, showing major functional sections thereof.

FIG. 14 shows an exemplary timing chart of the RT level circuit of FIG. 10.

In this case, an operation of the thread 1 is as follows.

As shown in FIG. 14, the thread 1 first tries to receive data from a synchronous channel i in a clock cycle c1 (rrx_i is set to "HIGH"), however, since data is not externally sent, the thread 1 waits until a clock cycle c6.

Next, in the clock cycle c6 the thread 1 receives data x1 from the synchronous channel i.

In a clock cycle c7 the thread 1 receives data y1 from the synchronous channel i to execute computation.

In a clock cycle c8 a result z1 of the computation is sent to a synchronous channel ch. This data is received by the thread 2 and immediately thereafter, communication is ended.

In the clock cycle c9, a receive request is sent to the synchronous channel i again.

In a clock cycle c11, the thread 1 receives data x2 from the synchronous channel i.

In a clock cycle c12, the thread 1 receives data y2 from the synchronous channel i to execute computation.

In a clock cycle c13, a result z2 of the computation is sent to the synchronous channel ch and received by the thread 2.

In a clock cycle c14, a receive request is sent outside the circuit.

An operation of the thread 2 is as follows.

First, in the clock cycle c1, the thread 2 outputs a receive request to a synchronous channel ch, and waits until the thread 1 sends data in the clock cycle c9.

Next, in the clock cycle c9 the thread 2 receives data z1 from the synchronous channel ch, and sends the data to a synchronous channel O.

In the clock cycle c12, sending on the synchronous channel O is ended, and the thread 2 outputs a receive request to the synchronous channel ch again.

In the clock cycle c14, the thread 2 receives data Z1 from the synchronous channel ch, and sends the data to the synchronous channel O.

As shown in FIG. 14, in a clock method in which a clock signal is always supplied, 14 clock operations occur in each of the threads 1 and 2, so that the load capacitance within a circuit driven by a clock is charged or discharged and power is consumed.

However, it is assumed that when the threads 1 and 2 are in a wait state in synchronous communication, clock supply is controlled. According to the example, when the gated clock method is used, the number of clocks (the number of risings of clock) supplied to the thread 1 and the thread 2 are eight and three, respectively.

Therefore, power consumption caused by clock signals for the threads 1 and 2 are reduced by factors of 8/14 and 3/14, respectively, as compared to a method in which a clock signal is always supplied. Thus, the high-level synthesis method of the present invention reduces the switching rate caused by clock signals by a factor of N/T where T is the number of clock cycles operated by a partial circuit, and the number of the clock cycles in a wait state is N.

Conventional circuit design at the RT and gate levels requires changes in design data, such as a HDL description, a net list, or the like, so as to use the gated clock method. In contrast, the low power consumption method of the present invention makes it possible to use original design data (behavioral description) without any changes, thereby deleting a period for designing low power consumption.

It should be noted that although it is not specified in the above-described example, a logic circuit configuration automatically constructed as design data by the high-level synthesis method using the high-level synthesis apparatus of the present invention from a behavioral description is subsequently produced. The power consumption of the produced logic circuit itself can be reduced by a low power consumption circuit. This is the effect of the present invention.

Further, in the above-described example, although it is not specified, the hardware configuration of the high-level synthesis apparatus 100 comprising the behavioral description analysis section 3, the thread division section 4, the CDFG generation section 6, the scheduling section 7, the allocation section 8, the data path generation section 9, the controller generation section 10, the low power consumption circuit generation section 11, the RT level circuit description generation section 12, and the RT level circuit storage section 13, further comprises an input section which is used by a user to perform input operations (a keyboard, a mouse, and the like), a memory section which stores a control program for controlling the high-level synthesis method of the present invention and its data (a RAM as a working memory and a ROM as a readable recording medium), a database (the behavioral description storage section 20 and the synchronous processing information storage section 5 or the like), and a control section which is controlled by input operation commands from the input section and executes the high-level synthesis method based on the control program in the ROM (CPU; central processing unit) Further, the hardware configuration of the high-level synthesis apparatus 100 comprises a display section, such as a liquid crystal display apparatus, and the like for displaying an initial screen, a guidance screen, an execution result, and the like.

Further, in the above-described example, a low power consumption circuit is synthesized and configured so that when a partial circuit (thread) is in a wait state, the operation of the partial circuit is stopped and, as a result, a switching rate α is decreased to reduce power consumption. The present invention is not limited to this. The power consumption P of a CMOS logic circuit is proportional to the switching rate α therefof, the load capacitance C thereof, the operating voltage $V^2$ thereof, and the operating frequency f. Therefore, alternatively, when a partial circuit (thread) is in a wait state, a low power consumption circuit which inhibits the operating voltage of the partial circuit may be synthesized. In this case, power consumption can be reduced. Particularly, a low power consumption circuit may be synthesized and configured so that when a partial circuit is in a wait state, the voltage level of a clock signal supplied to the partial circuit is inhibited. In this case, a low power consumption circuit in which power consumption caused by a clock signal can be reduced, can be synthesized.

As described above, according to the present invention, when a partial circuit is in a wait state, the operation of the partial circuit is stopped or inhibited. Therefore, the switching rate or operating voltage level of the partial circuit can be reduced. Further, since the power consumption of the logic circuit is proportional to the switching rate or operating voltage level thereof, a low power consumption circuit having a reduced power consumption can be synthesized.

Further, when a partial circuit is in a wait state, clock supply to the partial circuit is stopped or inhibited. Therefore, a low power consumption circuit in which power consumption caused by a clock signal which is consumed when the partial circuit is in a wait state can be reduced, can be synthesized.

Further, when a partial circuit is in a wait state during data transfer, the operation of the partial circuit is stopped or inhibited. Therefore, a low power consumption circuit in which the switching rate or operating voltage level of the partial circuit is decreased to reduce power consumption can be synthesized.

Further, a low power consumption circuit can be synthesized, in which when a partial circuit is in a wait state, a gated clock which does not generate a pulse is used to drive the partial circuit, so that power consumption caused by clock can be reduced.

Further, when a partial circuit is in a wait state, clock supply can be stopped or inhibited. Therefore, a low power consumption circuit in which power consumption caused by clock which is consumed in the wait state can be reduced can be synthesized.

Further, clock supply can be stopped or inhibited for each partial circuit when the partial circuit is in a wait state. Therefore, a low power consumption circuit, in which power consumption caused by clock which is consumed when each partial circuit is in a wait state, can be synthesized.

Further, if a high-level synthesis method for generating a low power consumption circuit, in which power which is uselessly consumed when a partial circuit is in a wait state is reduced, is used to design a logic circuit, and the designed logic circuit is produced, a logic circuit having the low power consumption circuit can be obtained.

Further, a control program stored in a recording medium can be used to realize the high-level synthesis method for a low power consumption circuit in which power which is uselessly consumed can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high-level synthesis apparatus for synthesizing a register transfer level logic circuit comprising a plurality of partial circuits from a behavioral description describing a processing operation of the circuit, comprising a low power consumption circuit generation section for generating a low power consumption circuit receiving inputs from two or more of the plurality of partial circuits which stops or inhibits circuit operations of one or each of the partial circuits constituting the logic circuit only when the one or each of the partial circuits are in a wait state, so to achieve low power consumption, wherein the low power consumption circuit stops or reduces the operations of partial circuits by stopping or reducing clock supply to the partial circuits, wherein the low power consumption circuit stops or inhibits the operations of the partial circuits when a data sender-end circuit or a data receiver-end circuit is in a wait state during data transfer between the partial circuits, wherein the data sender-end circuit is in a wait sate when the data sender-end circuit is transmitting data to a channel and a data receiver-end circuit is not receiving from the channel, wherein the data receiver-end circuit is in a wait state when the data receiver-end circuit is receiving data from a channel and the sender receiver-end circuit is not transmitting to the channel, and wherein the low power consumption circuit generation section is synthesized along with the logic circuit.

2. A high-level synthesis apparatus according to claim 1, wherein the low power consumption circuit generation section generates the low power consumption circuit which stops or reduces clock supply to the partial circuits when the partial circuits are in a wait state, based on synchronous processing information extracted from behavioral description information including synchronous communication information.

3. A high-level synthesis method for synthesizing a register transfer level logic circuit comprising a plurality of partial circuits from a behavioral description describing a processing operation of the logic circuit so as to construct a desired logic circuit, and producing the synthesized logic circuit, the method comprising the step of:

synthesizing, along with the logic circuit, a low power consumption circuit receiving inputs from two or more of the plurality of partial circuits which stops or inhibits circuit operations of one or each of the partial circuits constituting the logic circuit only when the one or each of the partial circuits are in a wait state, so to achieve low power consumption, wherein the synthesized low power consumption circuit stops or reduces the operations of partial circuits by stopping or reducing clock supply to the partial circuits, wherein the synthesized low power consumption circuit stops or inhibits the operations of the partial circuits when a data sender-end circuit or a data receiver-end circuit is in a wait state during data transfer between the partial circuits, wherein the data sender-end circuit is in a wait sate when the data sender-end circuit is transmitting data to a channel and a data receiver-end circuit is not receiving from the channel, and wherein the data receiver-end circuit is in a wait state when the data receiver-end circuit is receiving data from a channel and a sender receiver-end circuit is not transmitting to the channel.

4. A high-level synthesis method according to claim 3, wherein the synthesized low power consumption circuit controls the clock supply using a signal indicating the wait state.

5. A high-level synthesis method according to claim 3, wherein the synthesized low power consumption circuit controls the clock supply using a signal indicating the wait state.

6. A high-level synthesis method according to claim 3, wherein the synthesized low power consumption circuit stops or inhibits the operations of the partial circuits when a data sender-end circuit or a data receiver-end circuit is in a wait state during data transfer between the partial circuits.

7. A high-level synthesis method according to claim 3, wherein the synthesized low power consumption circuit generates a signal indicating the wait state of the partial circuits using a control signal for synchronous communication, and drives the partial circuits using a gated clock generated using the signal indicating the wait state of the partial circuits, so as to achieve low power consumption.

8. A high-level synthesis method according to claim 3, wherein the synthesizing step is carried out based on synchronous processing information extracted from behavioral description information including synchronous communication information, and the synthesized low power consumption circuit stops or reduces the operations of partial circuits by stopping or reducing clock supply to the partial circuits.

9. A high-level synthesis method according to claim 8, further comprising the steps of:

generating a signal for each partial circuit indicating that the partial circuit is in a wait state based on synchronous processing information extracted from behavioral description information including the synchronous communication information; and generating a gated clock for each partial circuit using the signal, wherein the synthesized low power consumption circuit drives the partial circuit using the generated gated clock, and stops the output of the gated clock supplied to the partial circuit when the partial circuit is in a wait state.

10. A high-level synthesis method according to claim 3, wherein the synthesized low power consumption circuit generates a signal indicating the wait state of the partial circuits using a control signal for synchronous communication, and drives the partial circuits using a gated clock generated using the signal indicating the wait state of the partial circuits, so as to achieve low power consumption.

11. A high-level synthesis method according to claim 3, wherein the synthesizing step is carried out based on synchronous processing information extracted from behavioral description information including synchronous communication information, and the synthesized low power consumption circuit stops or reduces the operations of partial circuits by stopping or reducing clock supply to the partial circuits.

12. A high-level synthesis method according to claim 11, further comprising the steps of:

generating a signal for each partial circuit indicating that the partial circuit is in a wait state based on synchronous processing information extracted from behavioral description information including the synchronous communication information; and generating a gated clock for each partial circuit using the signal, wherein the synthesized low power consumption circuit drives the partial circuit using the generated gated clock, and stops the output of the gated clock supplied to the partial circuit when the partial circuit is in a wait state.

13. A method for producing a logic circuit, wherein a high-level synthesis method according to claim 3 is used to design the logic circuit.

14. A computer readable recording medium comprising a control program for executing a high-level synthesis method according to claim 3.

* * * * *